(12) United States Patent
Garnier et al.

(10) Patent No.: US 11,309,269 B2
(45) Date of Patent: Apr. 19, 2022

(54) METHOD FOR PRODUCING A SOLDER BUMP ON A SUBSTRATE SURFACE

(71) Applicant: COMMISSARIAT A L'ENERGIE ATOMIQUE ET AUX ENERGIES ALTERNATIVES, Paris (FR)

(72) Inventors: Arnaud Garnier, Grenoble (FR); Laetitia Castagne, Grenoble (FR); Anthony De Luca, Grenoble (FR); Daniel Mermin, Grenoble (FR); Pierre Montmeat, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/977,987

(22) PCT Filed: Mar. 1, 2019

(86) PCT No.: PCT/FR2019/050468
§ 371 (c)(1),
(2) Date: Sep. 3, 2020

(87) PCT Pub. No.: WO2019/170987
PCT Pub. Date: Sep. 12, 2019

(65) Prior Publication Data
US 2021/0074659 A1    Mar. 11, 2021

(30) Foreign Application Priority Data

Mar. 9, 2018 (FR) ...................................... 1852069

(51) Int. Cl.
*H01L 23/00* (2006.01)
(52) U.S. Cl.
CPC ..... *H01L 24/11* (2013.01); *H01L 2224/11003* (2013.01); *H01L 2224/1132* (2013.01);
(Continued)

(58) Field of Classification Search
CPC ...................................................... H01L 24/11
See application file for complete search history.

(56) References Cited

U.S. PATENT DOCUMENTS

| 2003/0119300 A1 | 6/2003 | Chiu et al. |
| 2005/0277245 A1 | 12/2005 | Ohta et al. |
| (Continued) | | |

FOREIGN PATENT DOCUMENTS

| EP | 1 542 520 A1 | 6/2005 |
| JP | 3854213 B2 | 12/2006 |
| WO | WO 2016/019210 A1 | 2/2016 |

OTHER PUBLICATIONS

International Search Report dated Jul. 25, 2019 in PCT/FR2019/050468 filed on Mar. 1, 2019, 3 pages.
(Continued)

*Primary Examiner* — William A Harriston
(74) *Attorney, Agent, or Firm* — Oblon, McClelland, Maier & Neustadt, L.L.P.

(57) ABSTRACT

A serigraphy method for producing a soulder bump on the front surface of a substrate includes: forming a film on the front surface, forming an opening in the film, filling the opening with a souldering material, and removing the film. Forming a film on the front surface is preceded by the formation of an intermediate layer between the film and the front surface, the intermediate layer being adapted to exhibit a force of adherence at one and/or the other interface formed with the first front surface and the film lower than the force of adherence that can be formed between the film and the first front surface.

18 Claims, 3 Drawing Sheets

(52) U.S. Cl.
CPC ............... *H01L 2224/11614* (2013.01); *H01L 2224/11849* (2013.01)

(56) References Cited

U.S. PATENT DOCUMENTS

| | | | |
|---|---|---|---|
| 2007/0152024 A1* | 7/2007 | Pang | ........................ H01L 24/11 228/178 |
| 2009/0196000 A1 | 8/2009 | Pang et al. | |
| 2015/0194331 A1 | 7/2015 | Bai et al. | |
| 2017/0222148 A1 | 8/2017 | Defranco et al. | |

OTHER PUBLICATIONS

French Preliminary Search Report dated Oct. 26, 2018 in French Application 1852069 filed on Mar. 9, 2018, 1 page.

Maszara, W. P. et al., "Bonding of silicon wafers for silicon-on-insulator," J. Appl. Phys., vol. 64, No. 10, Nov. 1988, pp. 4943-4950.

U.S. Appl. No. 16/578,737, filed Sep. 23, 2019, US 2020/0094538 A1, Pierre Montmeat, et al.

U.S. Appl. No. 16/570,296, filed Sep. 13, 2019, US 2020/0090977 A1, Pierre Montmeat, et al.

\* cited by examiner

METHOD FOR PRODUCING A SOLDER BUMP ON A SUBSTRATE SURFACE

TECHNICAL FIELD

The present invention relates to a method for producing a solder bump on a face of a substrate, and in particular by screen printing through a film, advantageously a photosensitive film. In particular, the present invention implements an intermediate layer for facilitating removing the film after solder bumps are formed.

Prior Art

The assembly of a first substrate and a second substrate can involve forming solder bumps on a face of either of the first and second substrates in order to set up electric interconnections between devices likely to be present on either of the first and second substrates, but also to ensure mechanical cohesion of the assembly formed by the latter.

Forming solder bumps generally involves a step of heating at a temperature higher than their melting temperature (commonly called "Reflow"), providing said bumps with a truncated sphere shape. The "reflow" step enables in particular adhesion of solder bumps on the surface of which they are formed to be promoted, but also solder forming each of the bumps to be homogenised.

Additionally, during the step of assembling the first and second substrates, the solder bumps are also subjected to heating for changing them to liquid state, and thus promoting wetting of the assembling surfaces of each of the first and second substrates.

Among solutions enabling solder bumps to be formed, screen printing through a photosensitive dry film appears to be a choice technique.

Indeed, screen printing through a dry film offers the possibility to form solder bumps in the scale of the substrate with equipment often present in manufacturing plants for electronic components. Thus, technically controlling screen printing through a dry film, and the cost associated therewith are not an obstacle to the production of said bumps.

Additionally, screen printing through a dry film enables the formation of large diameter (higher than 50 μm, for example 80 μm) solder bumps at a relatively low pitch (for example in the order of 100 μm) to be contemplated.

Such a choice of bump diameter is often dictated by steps subsequent to assembling the first and second substrates. In particular, as an underfilling step is required, the bump diameter has to be sufficient to allow flow, by capillarity, of a filling material in the inter-substrate space provided by said bumps.

Other techniques of forming solder bumps such as electrolytic deposition, wafer level solder sphere placement, solder jetting or screen printing through a screen are not desirable either because they do not fulfil requisites in terms of bump diameter and pitch, or because their cost is incompatible with requisites of microelectronic industry.

Thus, a method, known from the state of the art, of producing solder bumps on a so-called front face, of a substrate, comprises the following steps:

a) a step of laminating a photosensitive dry film, for example Dupont WBR2075, covering the front face;

b) a step of forming openings in the photosensitive film, said openings being for delimiting the solder bumps;

c) a step of filling the openings, by screen printing, with a solder material for forming said bumps;

d) a step of removing the photosensitive dry film.

However, this method known from the state of the art is not satisfactory.

Indeed, step c) generally requires carrying out a heat treatment ("Reflow") at a temperature higher than 250° C. which directly affects physico-chemical properties of the photosensitive dry film, and enhances its adhesion energy with the surface on which it rests. Under these conditions, carrying out step d) requires employing very aggressive stripping or delamination chemical agents which can damage the front face, and in particular electronic structures or films likely to be present on said front face.

One purpose of the present invention is thereby to provide a method for producing structures, in particular solder bumps, according to the technique of screen printing through a less aggressive dry film than the method known from the state of the art.

DISCLOSURE OF THE INVENTION

The purpose of the invention is, at least partly, achieved by a method for producing by screen printing at least one solder bump on a face, called a first front face, a first substrate, the method comprising the following steps of:

a) a step of forming a film covering the first front face;

b) a step of forming at least one opening in the film, said at least one opening being for delimiting the at least one solder bump;

c) a step of filling, by screen printing, the at least one opening with a solder material so as to form the at least one solder bump;

d) a step of removing the film;

the method being remarkable in that step a) is preceded by forming an intermediate layer sandwiched between the film and the first front face, the intermediate layer being adapted to have an adhesion energy, at either of the interfaces formed with the first front face and the film, which is lower than the adhesion energy of an interface likely to be formed between the film and the first front face.

According to one implementation, step a) comprises laminating the preformed film, on the first front face.

According to one implementation, a heat treatment step c1) is carried out between steps c) and d), the heat treatment comprising temperature rise, advantageously temperature rise at a temperature higher than 250° C.

According to one implementation, the first front face is provided with at least one metal pad on which the at least one solder bump is formed, advantageously the metal pad comprises copper.

According to one implementation, the film comprises a photosensitive material.

According to one implementation, step b) comprises a photolithography step.

According to one implementation, step b) also comprises removing the intermediate layer from the bottom of the at least one opening.

According to one implementation, removing the intermediate layer from the bottom of the at least one opening is carried out by plasma etching, advantageously by an oxygen plasma.

According to one implementation, removing the intermediate layer from the bottom of the at least one opening is carried out by ion beam etching so as to re-deposit etching residues from the intermediate layer on the flanks of the at least one opening.

According to one implementation, removing the intermediate layer from the bottom of the at least one opening is preceded by forming an additional intermediate layer, having the same nature as the intermediate layer, covering the film, and from the bottom and the flanks of the at least one opening.

According to one implementation, forming the additional intermediate layer is followed by an anisotropic etching step adapted to remove the additional intermediate layer and the intermediate layer from the bottom of the at least one opening, and keep the additional intermediate layer on the flanks of the at least one opening.

According to one implementation, step d) is carried out by peeling.

According to one implementation, step d) is followed by a second heat treatment, step, called a step e) which comprises temperature rise for providing the at least one solder bump with a truncated sphere shape.

According to one implementation, step e) is followed by a step f) of assembling the first substrate with a second substrate, the assembling comprising contacting the at least one solder bump with a face, called a second front face, of the second substrate.

According to one implementation, step f) is followed by a step of filling the space included between the first and the second front faces with a polymeric material.

According to one implementation, the intermediate layer has a thickness lower than 100 nm, advantageously lower than 5 nm.

According to one implementation, the intermediate layer comprises a fluorinated polymer.

BRIEF DESCRIPTION OF THE DRAWINGS

Further characteristics and advantages will appear in the description that follows of a method for producing at least one solder bump according to the invention, given by way of non-limiting examples, with reference to the appended drawings in which.

DETAILED DISCLOSURE OF PARTICULAR EMBODIMENTS

The invention described in more detail below implements a method for forming solder bumps by screen printing through a film, for example a photosensitive film, advantageously a dry photosensitive film.

The screen printing step is generally followed by a step of removing the film, for example by dry etching or liquid or wet etching.

Within the scope of the present invention, an intermediate layer 20, for facilitating removing the film, is sandwiched between the film and the substrate on which the latter rests.

In FIGS. 1a to 1g, a first implementation of a method for forming solder bumps 50 on a face, called a first front face 12, of a first substrate 10 can be seen.

The first substrate 10 can comprise any substrate type made of a semi-conductor material, and in particular silicon.

Figure 1A:
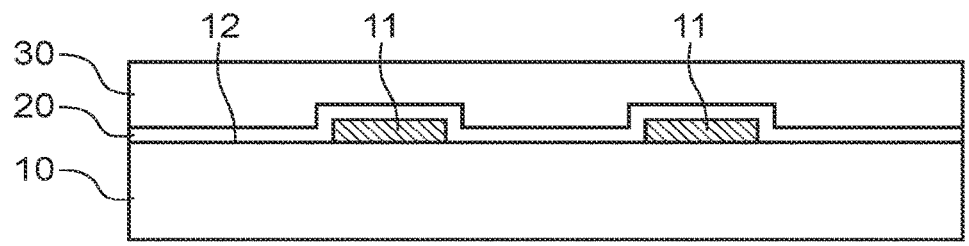
FIGS. 1a to 1g are schematic representations of the different steps of a first implementation of the method according to the present invention.

The first substrate 10 can also comprise on its first front face 12 bonding pads 11, for example bonding pads 11 made of copper, associated with devices formed on or in the first substrate 10 (FIG. 1a).

The method according to this first implementation then comprises a step of forming an intermediate layer 20, covering the first front face 12 of the first substrate 10.

Forming the intermediate layer 20 is followed by a step a) of forming a film 30 on said intermediate layer 20.

The film 30 can for example comprise a photosensitive material and thus form a photosensitive film.

By "photosensitive film", it is meant a film in which patterns or structures can be formed by a photolithography step. In particular, a photolithography step can comprise exposing said film through a mask defining patterns, followed by developing it so as to only keep part of the film.

The film 30 can be a dry film 30 which is deposited onto the intermediate layer 20 by a lamination method. For example, the film 30 can comprise SU8, a DuPont™ WBR™ Series resin, for example WBR2075.

Dry films can have relatively large thicknesses (for example thicknesses higher than 50 µm, or even higher than 80 µm) and thus allowing formation of solder bumps 50 with an also large diameter.

Particularly advantageously, the intermediate layer 20 is adapted to have an adhesion energy, at either of the interfaces formed with the first front face 12 and the film 30, lower than the adhesion energy of an interface likely to be formed between the film 30 and the first front face 12. In other words, the intermediate layer comprises a compound which has very low affinity for the film 30 and/or first front face 12.

Under these conditions, the intermediate layer 20 is adapted to allow removal of the film 30 according to less aggressive conditions than those known from the state of the art, for example by peeling, or even chemical etching of the intermediate layer 20.

Especially, the intermediate layer 20 can be chosen such that the adhesion energy between said layer at either of the interfaces formed with the first front face 12 and the film 30 is lower than 1 J/m² (the adhesion energy being measured by the Maszara method described in reference [1] cited at the end of the description).

The intermediate layer 20 can in particular comprise a fluorinated polymer.

For example, the fluorinated polymer can comprise at least one of the materials chosen from: MTS ($Cl_3Si(CH_2)_2(CF_2)_7CF_3$), FDDMCS ($CF_3(CF_2)_7(CH_2)_2(CH_3)_2SiCl$), OPTOOL (mixture of 80% perfluorohexane and 20% fluorinated compound).

The intermediate layer can also comprise OTS ($CH_3(CH_2)_{17}SiCl_3$).

The intermediate layer 20 can be formed from a thin film deposition technique, for example by dipping, spraying, plasma, using a spin coater. The intermediate layer 20 can also have a thickness lower than 100 nm, advantageously lower than 5 nm, even more advantageously lower than 2 nm.

Figure 1B:
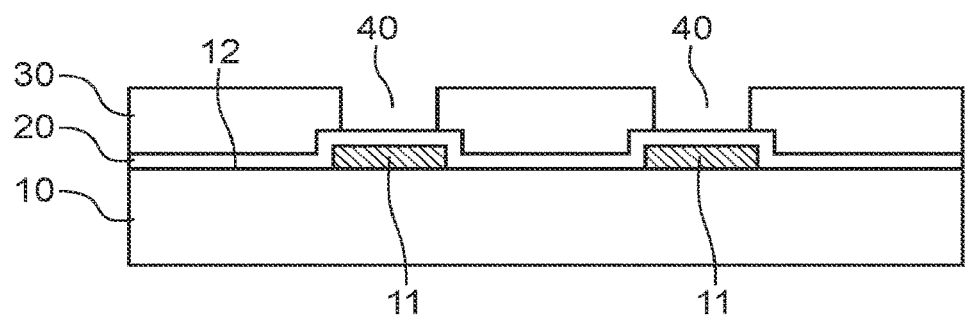

Step a) is followed by step b) which comprises forming openings 40, in the film 30, and for delimiting the solder bumps 50 (FIG. 1b).

If the film 30 is a photosensitive film, forming the openings 40 can comprise a photolithography step.

Alternatively and/or complementarily, forming the openings 40 can comprise a dry etching step, for example a plasma etching.

Additionally, as bonding pads 11 are present at the first front face 12, it is intended that the openings 40 are also for exposing said pads to the external environment.

The openings 40 have preferentially a circular cross-section, with a diameter higher than 50 µm, for example equal to 80 µm.

The present invention is however not limited to circular-shaped openings 40, and those skilled in the art can contemplate any other form as a function of requisites imposed thereto. For example, if they have to increase soldering volume, while keeping a small interconnection pitch, those skilled in the art could consider oblong-shaped openings 40.

Figure 1C:
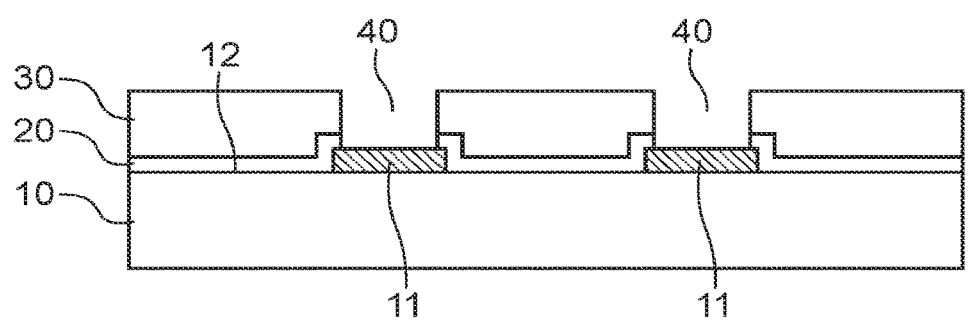

Forming the openings 40 according to this first implementation also comprises removing the intermediate layer 20 from the bottom of the openings 40 (FIG. 1c). This removal can then be carried out by dry etching, for example by dioxygen plasma etching.

Figure 1D:
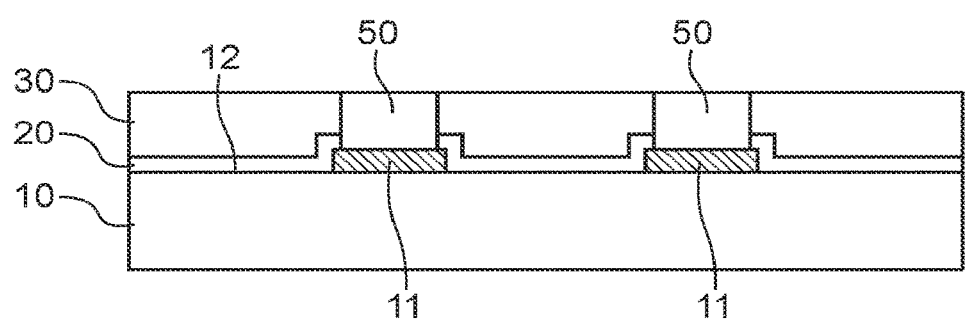

The step of forming the openings 40 is followed by a step c) of screen printing a soldering mixture for filling, at least partly, the volume of the openings 40 (FIG. 1d).

The soldering mixture can comprise any tin-based solder, in particular a tin, silver, and copper mixture, or a gold and tin mixture, indium-based solders or any other solder.

Figure 1E:
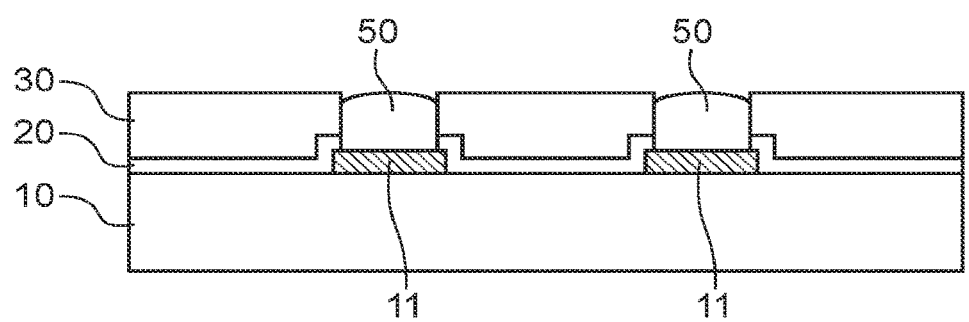

The screen printing can be followed by a heat treatment step c1) at a temperature higher than 250° C. for chemically homogenising solder and promoting its adhesion on the first front face 12, and possibly on the bonding pads 11 (FIG. 1e).

Figure 1F:
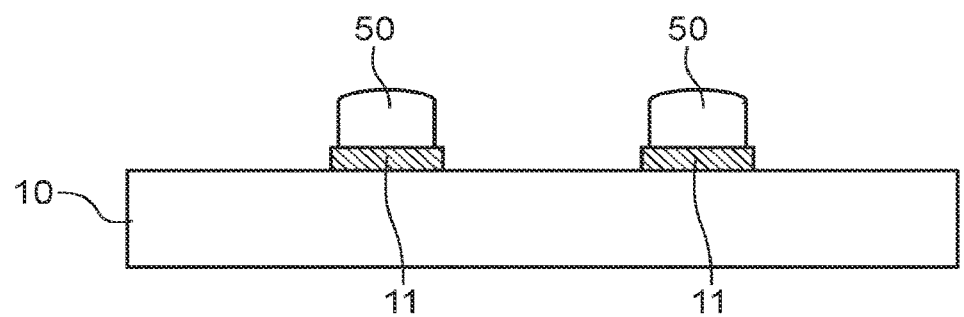

The film 30 can then be removed during a step d) thus leaving the solder bumps 50 on the first front face 12 (FIG. 1f).

The presence of the intermediate layer 20, due to its relatively low adhesion at either of the interfaces formed with the first front face 12 and the film 30, enables the photosensitive film 30 to be readily removed, for example by peeling. Alternatively, chemical etching of the intermediate layer 20 can also be considered.

Step d) of removing the film 30 can be preceded by a step of contour milling said film 30.

By "contour milling", it is meant removing or etching contour of the film 30 so as to facilitate peeling thereof.

Contour milling can be implemented as the film 30 is formed, for example before the openings 40 are formed, and at the same time as the openings 40 are formed.

For example, contour milling can be carried out before a step regardless of whether before or after the heat treatment step c1). Contour milling is however preferentially carried out after heat treatment step c1) (and certainly before step d)).

Particularly advantageously, contour milling of the film 30 can also comprise removing the portion(s) of the intermediate layer 20 exposed to open air, and in particular portions of the intermediate layer 20 extending from the flanks of the film 30, so as to facilitate carrying out step d) by peeling.

Figure 1G:
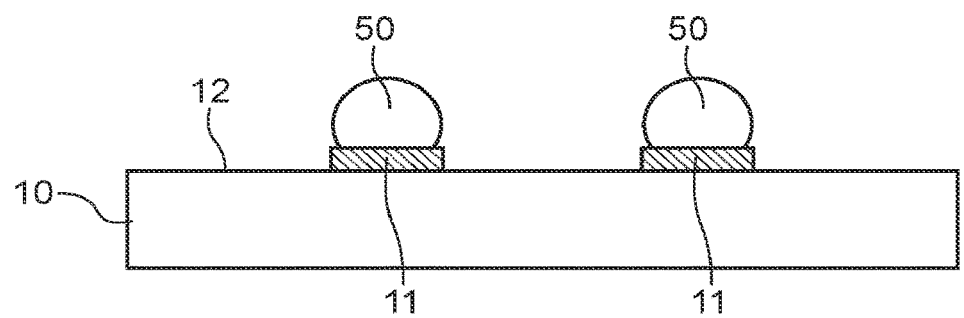

The solder bumps 50 can also be subjected to a second heat treatment step, called a step e), which comprises temperature rise for providing the at least one solder bump with a truncated sphere shape (FIG. 1g).

This step e) can be followed by a step f), of assembling the first substrate 10 with a second substrate, which comprises contacting the at least one solder bump with a face, called a second front face, of the second substrate. Step f) can also be preceded by removing the intermediate layer 20.

Step f) can be followed by a step of filling the space included between the first and the second front faces with a polymeric material.

This filling step is for ensuring better mechanical cohesion of the assembly formed by the first and second substrates.

Figure 2A:
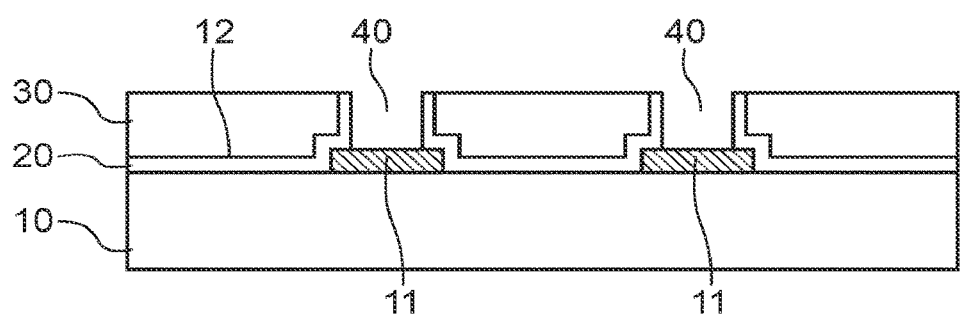
FIGS. 2a and 2b are schematic representations of the step of removing the intermediate layer from the bottom of the openings according to a second implementation of the method according to the present invention.
Figure 2B:
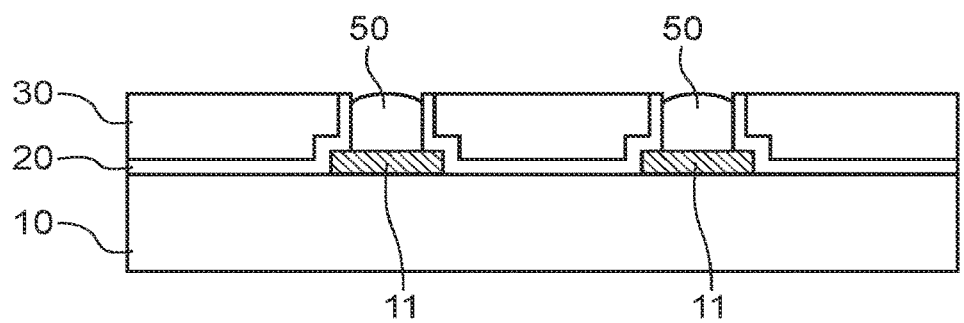

In FIGS. 2a and 2b, a second implementation of a method for forming solder bumps 50 according to the present invention can be seen.

This second embodiment differs from the first one in that removing the intermediate layer 20 from the bottom of the openings 40 is carried out by Ion Beam Etching (IBE) so as to re-deposit etching residues from the intermediate layer 20 on the flanks of the openings 40. In other words, the intermediate layer 20 is again formed at the flanks of the openings 40. Reforming the intermediate layer 20 on the flanks of the openings 40 thereby limits adhesion of solder formed by screen printing on said flanks.

Figure 3A:
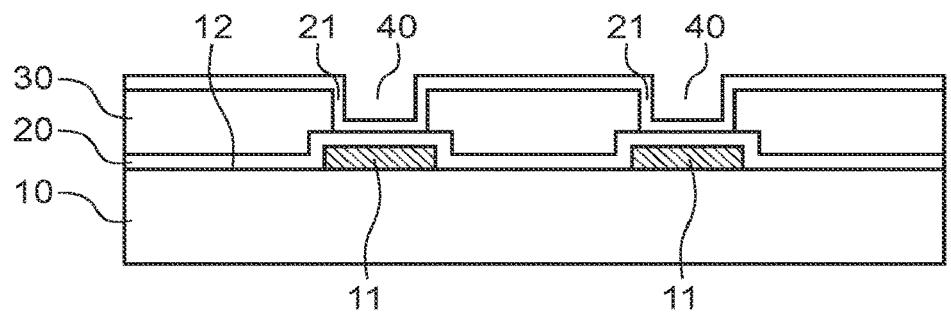
FIGS. 3a to 3c are schematic representations relating to forming an additional intermediate layer according to a third implementation of the method according to the present invention.
Figure 3B:
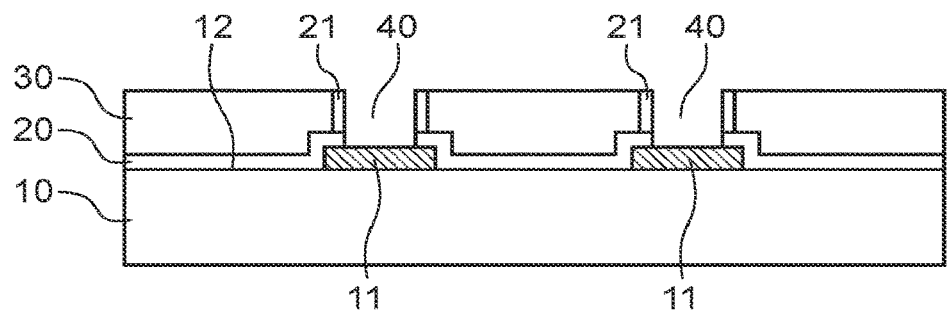
Figure 3C:
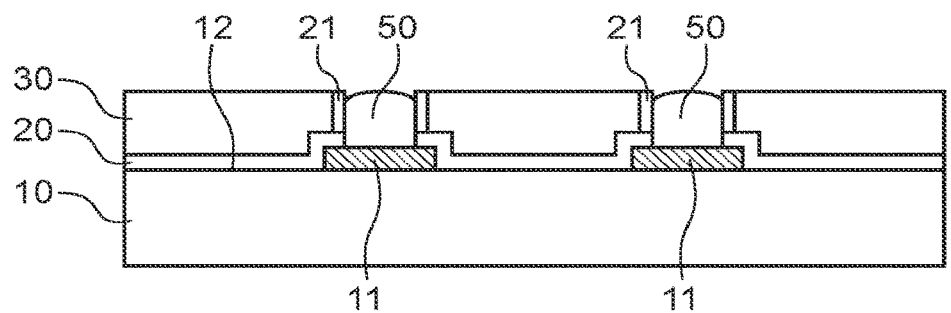

In FIGS. 3a to 3c, a third implementation of a method of forming solder bumps 50 according to the present invention can be seen.

This third embodiment differs from the first one in that removing the intermediate layer 20 from the bottom of the openings 40 is preceded by forming an additional intermediate layer 21, having the same nature as the intermediate layer, covering the photosensitive film 30, and from the bottom and flanks of the openings 40 (FIG. 3a).

The additional intermediate layer 21 can be formed by a plasma method, for example with a $C_xF_y$ ICP (Inductive Coupled Plasma) plasma.

Forming the additional intermediate layer 21 is then followed by an anisotropic etching step adapted to remove the additional intermediate layer 21 and the intermediate layer from the bottom of the openings 40, while keeping the additional intermediate layer 21 on the flanks of the openings 40 (FIG. 3b).

All the three implementations of the method according to the present invention thus enable large diameter solder bumps 50 which are spaced apart from each other by a small distance to be produced by screen printing through a photosensitive film 30.

Additionally, the implementation of the intermediate layer enables the photosensitive film 30 to be removed according to conditions which prevent the solder bumps 50 and/or devices likely to be present on the first front face 12 from being degraded.

REFERENCES

[1] Maszara et al., «Bonding of silicon wafers for silicon-on-insulator», J. Appl. Phys. 64 (10), 15 Nov. 1988.

The invention claimed is:

1. A method for producing by screen printing at least one solder bump on a first front face of a first substrate, the method comprising the following steps:
  a) a step of forming a film covering the first front face;
  b) a step of forming at least one opening in the film, said at least one opening being for delimiting the at least one solder bump;
  c) a step of filling, by screen printing, the at least one opening with a solder material so as to form the at least one solder bump;
  d) a step of removing the film; and
  a step preceding step a) includes forming an intermediate layer sandwiched between the film and the first front face,
  wherein the intermediate layer has an adhesion energy, at either interface formed with the first front face and the film, which is lower than the adhesion energy of an interface likely to be formed between the film and the first front face.

2. The method according to claim 1, wherein step a) comprises laminating the preformed film, on the first front face.

3. The method according to claim 1, wherein a heat treatment step c1) is carried out between steps c) and d), the heat treatment comprising temperature rise.

4. The method according to claim 1, wherein the first front face is provided with at least one metal pad on which the at least one solder bump is formed.

5. The method according to claim 1, wherein the film comprises a photosensitive material.

6. The method according to claim 5, wherein step b) comprises a photolithography step.

7. The method according to claim 1, wherein step b) also comprises removing the intermediate layer from the bottom of the at least one opening.

8. The method according to claim 7, wherein removing the intermediate layer from the bottom of the at least one opening is carried out by plasma etching.

9. The method according to claim 7, wherein removing the intermediate layer from the bottom of the at least one opening is carried out by ion beam etching so as to re-deposit etching residues from the intermediate layer on the flanks of the at least one opening.

10. The method according to claim 7, wherein removing the intermediate layer from the bottom of the at least one opening is preceded by forming an additional intermediate layer, having the same nature as the intermediate layer, covering the film, and from the bottom and the flanks of the at least one opening.

11. The method according to claim 10, wherein forming the additional intermediate layer is followed by an anisotropic etching step adapted to remove the additional intermediate layer and the intermediate layer from the bottom of the at least one opening, and keep at least partly the additional intermediate layer on the flanks of the at least one opening.

12. The method according to claim 1, wherein step d) is carried out by peeling.

13. The method according to claim 1, wherein step d) is followed by a second heat treatment step, called a step e) which comprises temperature rise for providing the at least one solder bump with a truncated sphere shape.

14. The method according to claim 13, wherein step e) is followed by a step f) of assembling the first substrate with a second substrate, the assembling comprising contacting the at least one solder bump with a face, called a second front face, of the second substrate.

15. The method according to claim 14, wherein step f) is followed by a step of filling the space included between the first and the second front faces with a polymeric material.

16. The method according to claim 1, wherein the intermediate layer has a thickness lower than 100 nm.

17. The method according to claim 1, wherein the intermediate layer comprises a fluorinated polymer.

18. The method according to claim 1, wherein the adhesion energy between the intermediate layer and either of the interfaces with the first front face and the film, is lower than 1 $J/m^2$.

* * * * *